(12) United States Patent
Van Hoof et al.

(10) Patent No.: US 10,915,033 B2
(45) Date of Patent: Feb. 9, 2021

(54) LITHOGRAPHIC APPARATUS AND DEVICE MANUFACTURING METHOD

(71) Applicant: ASML NETHERLANDS B.V., Veldhoven (NL)

(72) Inventors: Bram Van Hoof, Wintelre (NL); Jeroen Cottaar, Eindhoven (BE)

(73) Assignee: ASML Netherlands B.V., Veldhoven (NL)

( * ) Notice: Subject to any disclaimer, the term of this patent is extended or adjusted under 35 U.S.C. 154(b) by 319 days.

(21) Appl. No.: 15/779,758

(22) PCT Filed: Nov. 17, 2016

(86) PCT No.: PCT/EP2016/078023
§ 371 (c)(1),
(2) Date: May 29, 2018

(87) PCT Pub. No.: WO2017/102237
PCT Pub. Date: Jun. 22, 2017

(65) Prior Publication Data
US 2020/0326637 A1  Oct. 15, 2020

(30) Foreign Application Priority Data
Dec. 15, 2015 (EP) .................................... 15200110

(51) Int. Cl.
*G03F 9/00* (2006.01)
*G03F 7/20* (2006.01)
(52) U.S. Cl.
CPC ........ *G03F 9/7034* (2013.01); *G03F 7/70775* (2013.01)
(58) Field of Classification Search
CPC .................................................. G03F 9/7034
See application file for complete search history.

(56) References Cited

U.S. PATENT DOCUMENTS 6,172,373 B1 * 1/2001 Hara ...................... G03F 7/707
250/548
2005/0128454 A1   6/2005 Ina et al.
(Continued)

FOREIGN PATENT DOCUMENTS

CN          102193329 B       9/2014
CN          104350424 A       2/2015
(Continued)

OTHER PUBLICATIONS

Office Action issued in CN Application No. 201680073173.3 dated Dec. 2, 2019, 15 pages (with English-language translation).
(Continued)

*Primary Examiner* — Steven Whitesell Gordon
(74) *Attorney, Agent, or Firm* — Sterne Kessler Goldstein & Fox P.L.L.C

(57) ABSTRACT

Combination of a stage and a level sensor configured to sense a height level at a target location on an object is described, the stage comprising an object table configured to hold the object and a positioning device for displacing the object table relative to the level sensor in a first direction, the level sensor comprising a projection system configured to project a measurement beam onto a measurement area of the object, the measurement area having a measurement area length in the first direction, a detector system configured to receive different portions of the measurement beam after being reflected off different sub-areas within the measurement area, the different sub-areas being arranged in the first direction, and to supply output signals representative of the different portions received, a signal processing system configured to process the output signals from the detector system.

13 Claims, 11 Drawing Sheets

(56) References Cited

U.S. PATENT DOCUMENTS

| | | | |
|---|---|---|---|
| 2010/0231889 A1* | 9/2010 | Den Boef | ............ G03F 9/7034 355/72 |
| 2011/0273686 A1 | 11/2011 | Sato | |
| 2013/0077079 A1* | 3/2013 | Den Boef | ............ G03F 9/7034 355/72 |
| 2013/0128247 A1 | 5/2013 | Khuat et al. | |
| 2014/0152991 A1 | 6/2014 | Heo et al. | |

FOREIGN PATENT DOCUMENTS

| | | | |
|---|---|---|---|
| EP | 0793073 | A2 | 9/1997 |
| JP | 2000323404 | A | 11/2000 |
| JP | 2001255139 | A | 9/2001 |
| JP | 2004259815 | A | 9/2004 |
| JP | 2009105414 | A | 5/2009 |
| JP | 2009239273 | A | 10/2009 |
| JP | 2011035333 | A | 2/2011 |
| JP | 2011203248 | A | 10/2011 |
| JP | 2011209278 | A | 10/2011 |
| JP | 2012185727 | A | 9/2012 |
| JP | 2014527724 | A | 10/2014 |
| WO | 2005088686 | A1 | 9/2005 |
| WO | 2014074868 | A1 | 5/2014 |

OTHER PUBLICATIONS

PCT/EP2016/078023 International Search Report dated Feb. 15, 2017.

International Preliminary Report on Patentability of the International Searching Authority directed to related International Patent Application No. PCT/EP2016/078023, dated Jun. 19, 2018; 6 pages.

Written Opinion of the International Searching Authority directed to related International Patent Application No. PCT/EP2016/078023, dated Feb. 15, 2017; 5 pages.

Office Action issued in Japanese Application No. 2018-531334, dated Jul. 23, 2019, 6 pages (with English Translation).

\* cited by examiner

LITHOGRAPHIC APPARATUS AND DEVICE MANUFACTURING METHOD

CROSS-REFERENCE TO RELATED APPLICATIONS

This application is the U.S. National Stage Application of International Patent Application No. PCT/EP2016/078023, filed on Nov. 17, 2016 which claims priority of EP application 15200110.3 which was filed on Dec. 15, 2015 both of which are incorporated herein in their entirety by reference.

FIELD OF THE INVENTION

The present invention relates to a combination of a stage and a level sensor, a lithographic apparatus and a method for manufacturing a device.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to accurately project or transfer the pattern onto a target portion of the substrate, various properties of the substrate to be exposed are measured. One of the properties that is determined is a so-called height map of the substrate, the height map providing insight in the actual height profile of the substrate. Knowledge of the actual height profile of the substrate, in particular the height profile of the target portions, is needed to ensure that the substrate is positioned in or near a focal plane of the projection system during the exposure of the pattern onto the target portion. Typically, in order to assess the height profile of the substrate, a so-called level sensor is used, such level sensor e.g. including a light source configured to project a light beam onto a surface of a substrate; a detector configured to detect a reflection of the light beam from the surface of the substrate; and a processor configured to determine a position of the substrate on the basis of at least a detected reflection of the light beam from the surface of the substrate. Typically, a level sensor is configured to project an array of discrete light beams at different positions on the substrates, thereby illuminating the different positions with a spot of light, i.e. a measurement spot, e.g. having a rectangular cross-section. Based on the reflected light beams, a height of the substrate at the different positions can be determined. The height at a certain position as determined in this manner is typically an averaged height of the substrate over the area covered by the measurement spot. The size of such a measurement spot is typically a trade-off between a desired resolution of the height map and the sensitivity of the detector. Due to this, known level sensors may provide in a substrate height map that is insufficiently accurate, in particular at or near the edge of the substrate.

SUMMARY

It is desirable to provide in a level sensor system enabling an improved resolution. According to an embodiment of the invention, there is provided, as such a system, a combination of a stage and a level sensor configured to sense a height level at a target location on an object, the stage comprising:
an object table configured to hold the object and
  a positioning device for displacing the object table relative to the level sensor in a first direction;
the level sensor comprising:
a projection system configured to project a measurement beam onto a measurement area of the object, the measurement area having a measurement area length in the first direction;
a detector system configured to receive different portions of the measurement beam after being reflected off different sub-areas within the measurement area, the different sub-areas being arranged in the first direction, and to supply output signals representative of the different portions received;
a signal processing system configured to process the output signals from the detector system, the signal processing system being configured to, during a displacement of the object in the first direction by the stage:
  consecutively retrieve, for each of the different sub-areas, an output signal representative of the received portion of the measurement beam when the target location is in the sub-area and;
    determine the height level of the target location, based on a combination of the output signals.

According to another aspect of the present invention, there is provided a lithographic apparatus including an illumination system configured to condition a radiation beam; a support constructed to support a patterning device, the patterning device being capable of imparting the radiation beam with a pattern in its cross-section to form a patterned radiation beam; a projection system configured to project the patterned radiation beam onto a target portion of a substrate, and a combination of a stage and a level sensor according to the present invention, whereby the object table is configured to hold the substrate and the level sensor is configured to sense a height level at a target location on the substrate.

According to yet another aspect of the present invention, there is provided a device manufacturing method comprising projecting a patterned beam of radiation onto a substrate, wherein the step of projecting the patterned beam of radiation is preceding by a step of determining a height map of the substrate using a combination of a stage and a level sensor according to the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
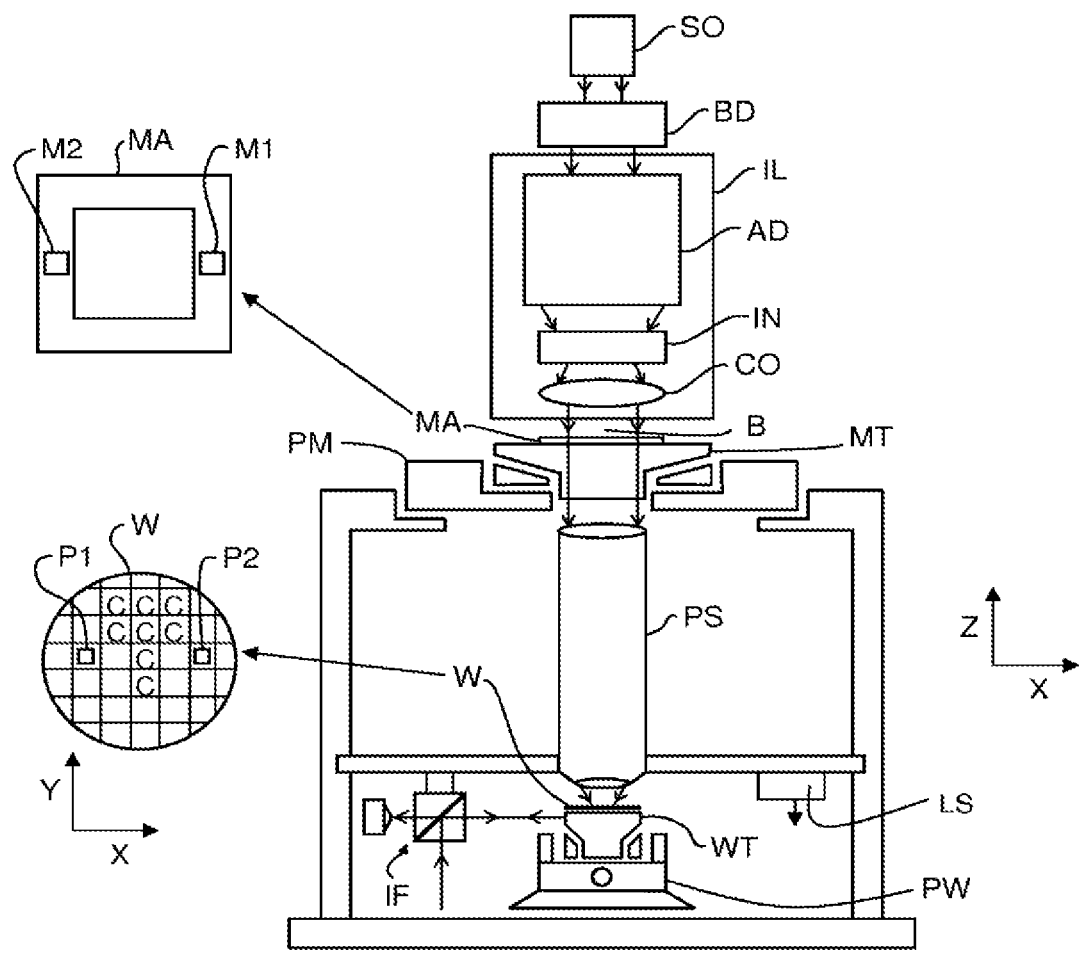
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above. Combinations and/or variations on the above described modes of use or entirely different modes of use may also be employed.

The lithographic apparatus according to the present invention further comprises a level sensor LS. In an embodiment, the present invention provides in a combination of a stage and a level sensor that is configured to sense a height level at a target location on an object. In such combination, the stage may comprise an object table configured to hold the object and a positioning device for displacing the object table relative to the level sensor. In an embodiment, the positioning device may e.g. comprise one or more actuators and/or motors for displacing the object table. Examples of such actuators or motors may e.g. include Lorentz actuators, reluctance actuators, planar motors, linear motors, etc. In a embodiment, the positioning device may include a module for fine positioning of the object table and a module for coarse positioning of the object table. When applied in a lithographic apparatus according to the present invention, the object table may e.g. correspond to the substrate table WT as shown.

In the embodiment as shown, the level sensor LS is provided remote from the projection system PS. In such an arrangement, the lithographic apparatus may e.g. be configured to process one substrate (e.g. determine a height map using the level sensor LS), while another substrate is being exposed. In such an arrangement, the lithographic apparatus may e.g. be a dual stage apparatus, having two substrate tables WT (not shown) that can be positioned by one or more positioners such as the positioner PW.

As an alternative, the level sensor LS may also be provided underneath or adjacent the projection system PS.

Figure 2:
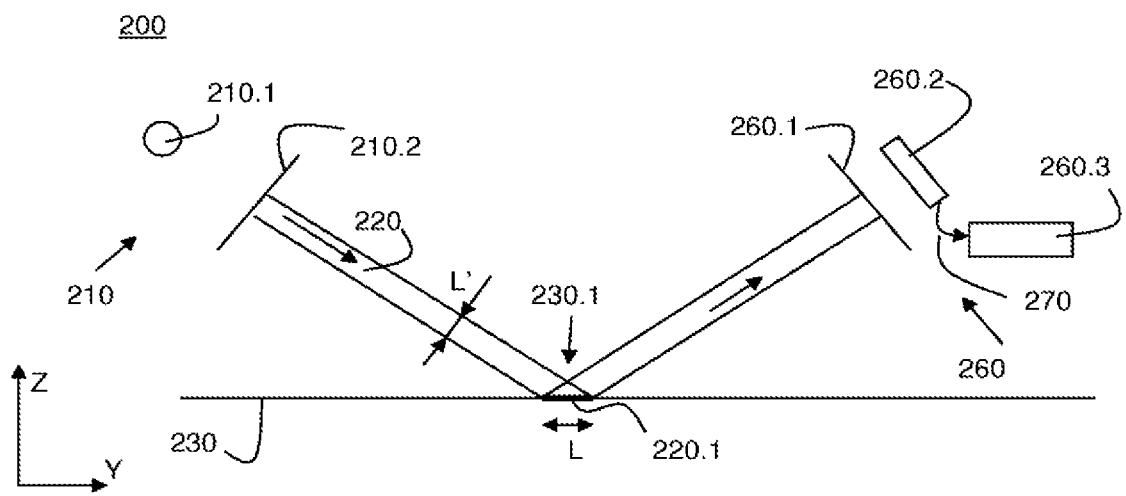
FIG. 2 depicts a level sensor as known in the art.

FIG. 2 schematically depicts a general set up of a level sensor 200 as can be applied to determine a height level at a particular location, also referred to as a target location, of an object e.g. a substrate that is to be exposed in a lithographic apparatus. The level sensor 200 comprises a projection system 210 that is configured to generate and project a measurement beam 220 at an angle of incidence onto an object 230, e.g. at a target location 230.1 from which the height level, i.e. the position in the Z-direction, is to be determined. In order to generate and project the measurement beam 220, the projection system 210 comprises a light source 210.1, to generate a light beam that is imparted by a projection grating 210.2 of the projection system 210, to generate the measurement beam 220. The light source 210 may e.g. be a broad band light source, for example, in a range of 200 nm-500 nm or 600-1050 nm. The projection grating 210.2 may e.g. comprise a pattern having a pitch P of e.g. 30 μm. The measurement beam 220 impacts the object 230 and forms a measurement spot or measurement area 220.1 on the object having a length L. the length L depending on the cross-sectional size L' of the measurement beam 220 and the angle of incidence of the measurement beam onto the object 230. In order to determine the height level at the target location 230.1, the level sensor 200 further comprises a detection system 260, the detection system 260 comprising a detection grating 260.1, a detector 260.2 and a processing unit 260.3 for processing an output signal 270 of the detector 260.2. By means of triangulation techniques, the height level at the target location 230.1 can be determined. The detected height is typically related to the signal strength as measured by the detector 260.2, the signal strength having a periodicity that depends on the pitch P of the applied grating 210.2 and the angle of incidence.

A level sensor 200 as schematically shown in FIG. 2 may e.g. be applied to determine a so-called height map of a substrate that is to be processed in a lithographic apparatus. In order to cover the substrate's surface effectively, a level sensor may be configured to project an array of measurement beams such as beams 220 onto the substrate's surface, thereby generating an array of measurement areas or spots covering a larger measurement range.

Figure 3:
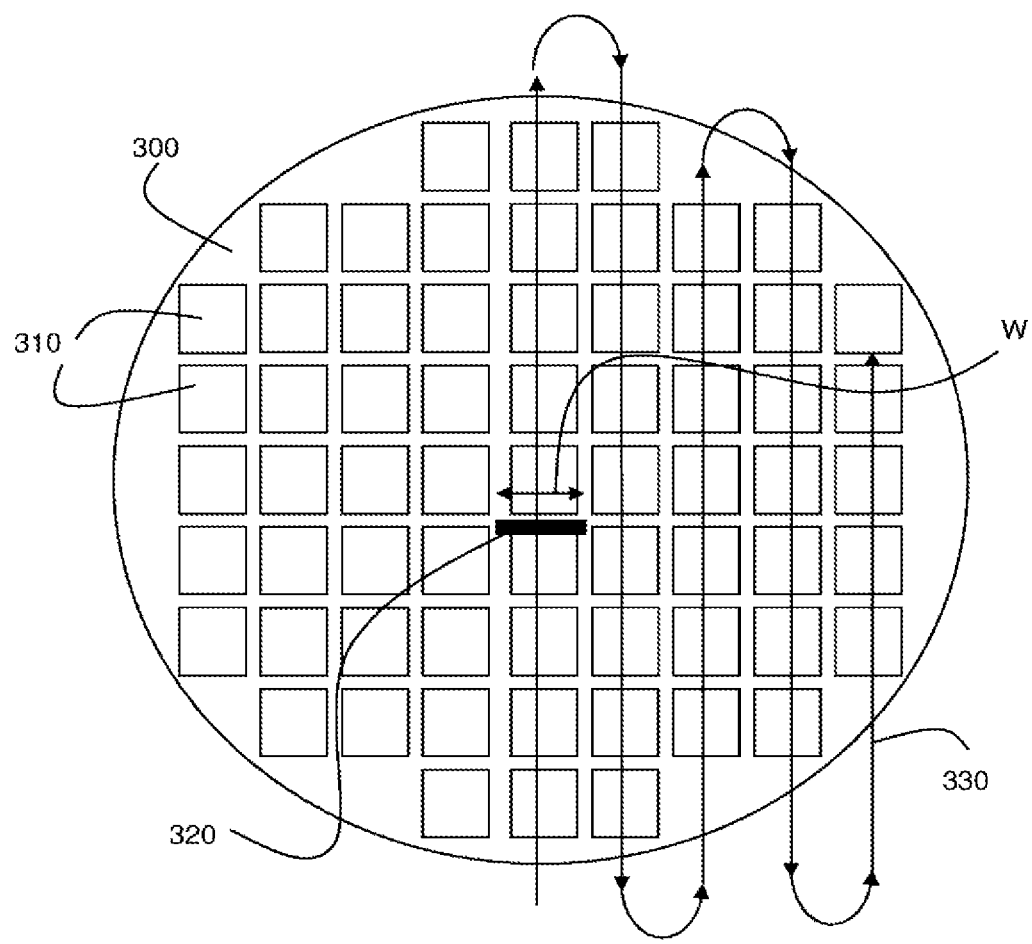
FIGS. 3 and 4 depict a top view of a substrate and measurement area of a level sensor.

FIG. 3 schematically shows a top view of a substrate 300 having a plurality of target portions 310 onto which a pattern is to be exposed. FIG. 3 further schematically shows a combined measurement area 320 formed by an array of measurement spots as generated by a level sensor that is used to determine the height map of the substrate. In order to determine the height map of the entire substrate, the level sensor and the substrate 300 may be displaced relative to each other, e.g. along a meandering path 330. Such a relative displacement of the substrate and the level sensor may also be referred to as a scanning of the substrate by the level sensor. Note that by either enlarging the width W of the combined measurement area 320 or by applying an array of multiple similar level sensors, e.g. arranged adjacent each other in the X-direction, the measurement range can be increased even further.

Figure 4:
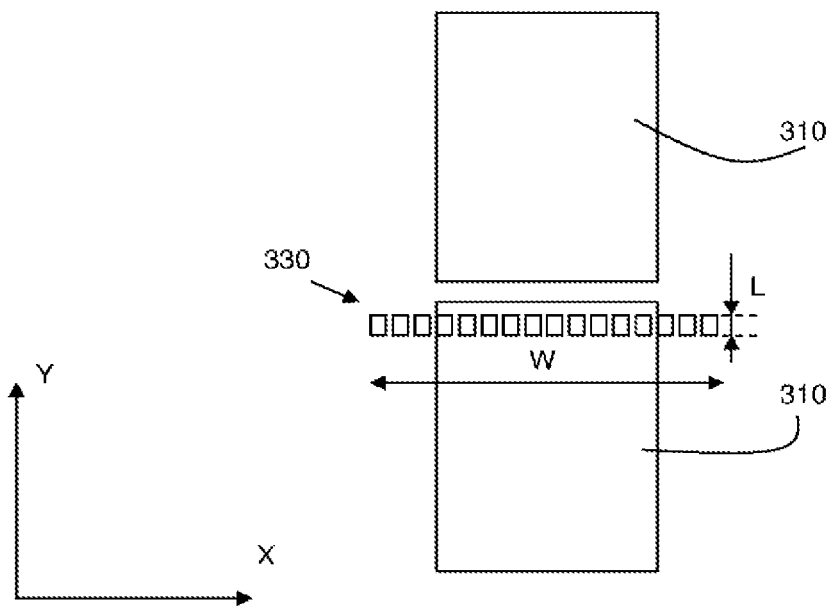

FIG. 4 schematically shows a more detailed top view of two target portions 310 on a substrate and a array of measurement areas or measurement spots 330 provided by a level sensor, spanning a measurement range W.

Figure 5:
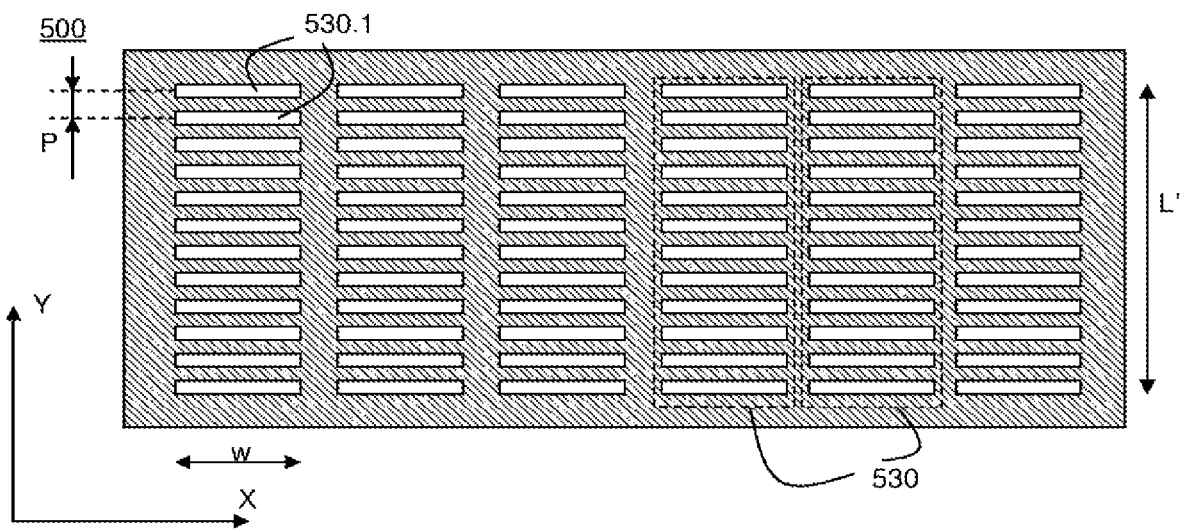
FIG. 5 depicts a projection grating as can be applied in a level sensor.

The measurement areas or spots 330 may e.g. have a length L, similar to the length L as shown in FIG. 2, in the Y-direction, i.e. the direction in which the substrate is displaced relative to the level sensor and the combined measurement area of the spots 330 may span a width equal to the measurement range 320 of FIG. 2 in the X-direction, perpendicular to the Y-direction. Rather than having discrete measurement spots 330 arranged in the X-direction, a continuous measurement beam, spanning the width W may also be applied. In order to generate a plurality of measurement spots 330 as shown in FIG. 4, a projection grating as shown in FIG. 5 may be applied. The grating 500 as shown is a transmissive grating for generating 6 measurement beams through groups of apertures 530, each measurement beam being formed by a plurality of rectangular apertures 530.1, positioned at a pitch P, resulting in a measurement beam height L', as can also be seen in FIG. 2. A typical example of such a projection grating 500 may have the following dimensions:

Pitch P=30 μm;
Number of measurement areas=30;
Number of apertures per area 530=60;
Width w of a measurement spot=1 mm;

Using such a grating, a measurement range spanning a width of approx. 50 mm can be obtained. Note that the width of a measurement beam (i.e. corresponding to the width w of the apertures 530.1) is substantially maintained by the projection onto the object and thus corresponds to a width of the measurement spots or areas on the object, whereas the measurement beam height L' is converted, by the projection, to a measurement area having a length L, as can be seen in FIG. 2.

Using a level sensor as described above, a height level of an object, e.g. a substrate, may be determined with a resolution in the Y-direction that is substantially inversely proportional to the length of the measurement area or spot, e.g. length L as shown in FIG. 2 or 5. Phrased differently, a level sensor as described above may generate a single height value for a measurement area having a length L, the single height value substantially corresponding to the average height of the object over this measurement area.

It would be desirable to increase the spatial resolution of a level sensor, in particular to assess the height map of a substrate near the edge of the substrate in more detail.

Figure 6:
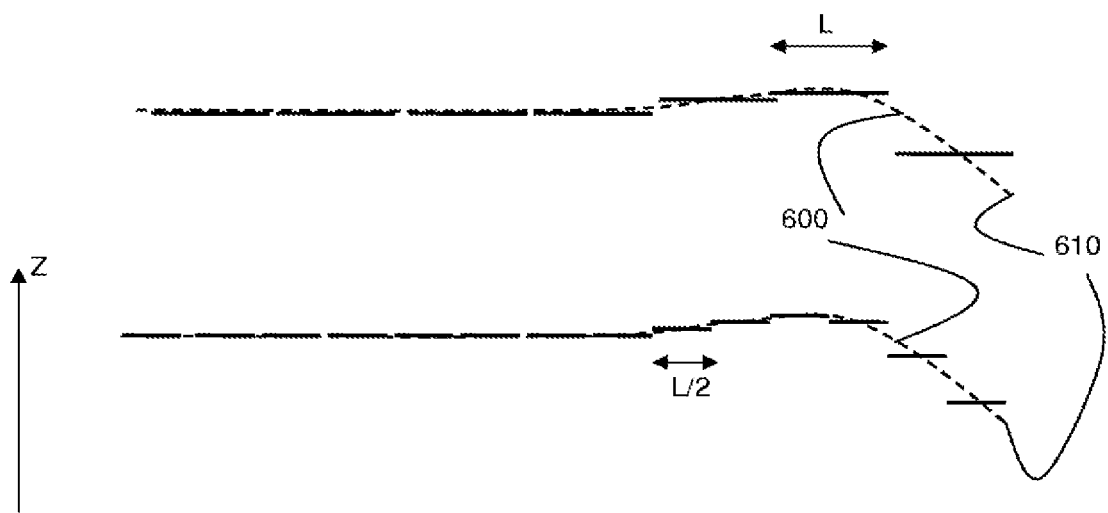
FIG. 6 illustrates the effect of an enhanced resolution on a height measurement near an edge of a substrate.

FIG. 6 illustrates the effect in case the resolution could be doubled, i.e. in case the length of a measurement area could be halved. FIG. 6 schematically shows a cross-sectional view of a portion of a substrate 600 including an edge 610. Near the edge, a significant deformation (in the Z-direction) can be noticed. In FIG. 6, the solid horizontal line segments 620 represent measured height levels, the height level being indicated by the vertical position (in de Z-direction) of the segments 620, the length of the line segments 620 corresponding to the length of the measurement area as applied. In the upper graph of FIG. 6, the measurement area length as applied is equal to L, whereas in the lower graph of FIG. 6, a measurement area length equal to L/2 is applied. As can be seen, by applying the smaller measurement area length, a more accurate height profile can be established. The deformation of the substrate near the edge 610 portion as schematically shown in FIG. 6 may be referred to as "edge roll off". This phenomenon may be caused by, e.g., by curl down of the wafer due to native warpage in the wafer. Typically, a substrate is mounted on a substrate table, the substrate table being provided with one or more clamps, e.g. vacuum clamps or electrostatic clamps to hold the substrate. A supporting surface of the substrate table, i.e. the surface onto which the surface is mounted, typically comprises a plurality of burls onto which the substrate is mounted. Beyond the last of these supporting burls, the wafer is less restricted to assume its native warped shape which may result in the deformation shown in FIG. 6.

Due to the limited resolution of the height level measurement using a measurement area length L as shown in FIG. 6, there may be a comparatively large discrepancy between the height map as determined and the actual height of the substrate, in particular near the edge of the substrate. Since the height map is used in the exposure process to ensure that the substrate is positioned in or near a focal plane of the projection system, e.g. projection system PS as shown in FIG. 1, an inaccurate height map may have an adverse effect on the focusing of the substrate during the exposure.

With reference to FIG. 2, one can observe that the measurement area length L could easily be adjusted by changing the measurement beam height L'. It has however been observed by the inventors that a mere decrease of the measurement area length L, e.g. by reducing the measurement beam height L', may adversely affect the measurement accuracy. By decreasing the measurement area length L, or spot length, the amount of radiation as received by the detector is reduced, resulting in a poorer signal-to-noise ratio. As a result, the theoretical gain in resolution one would expect when decreasing the measurement area length L, is not obtained in practice by a mere decrease of the measurement area length L. Therefore, the present invention provides in an alternative manner of increasing the resolution of a level sensor, while substantially maintaining the measurement accuracy.

Figure 7:
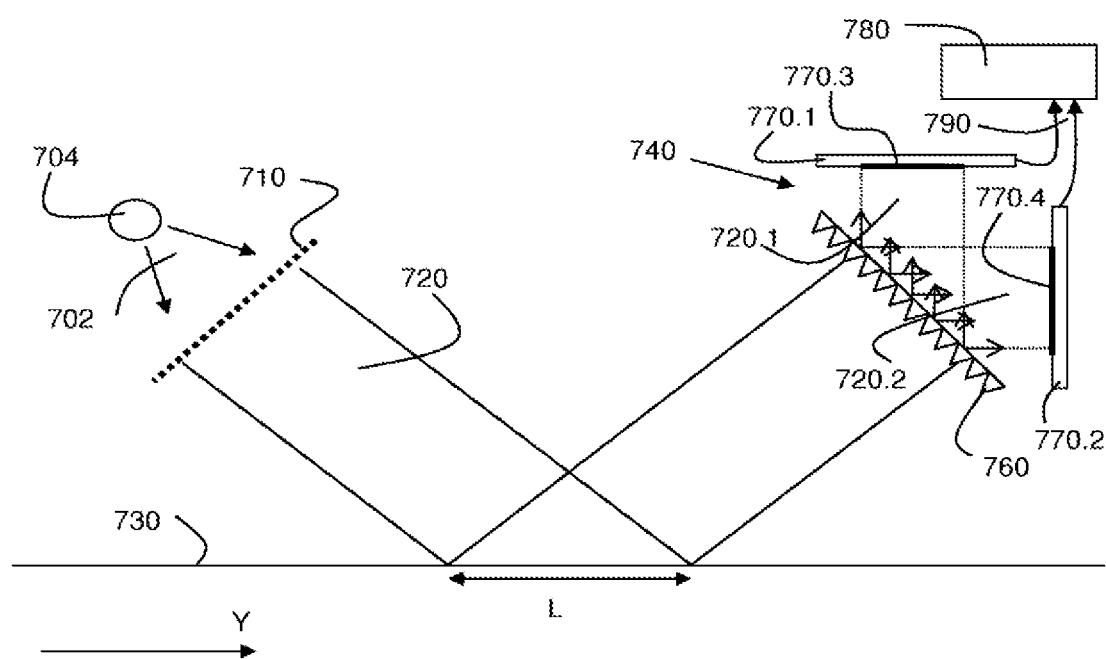
FIG. 7 depicts a measurement principle as applied in a level sensor known in the art.

For reference purposes, FIG. 7 describes in more detail the measurement principle as applied in a level sensor as known in the art. FIG. 7 schematically shows a measurement beam 720 generated by imparting a light beam 702 from a light source 704 with a projection grating 710, the measurement beam 720 being projected on a surface 730 of an object, e.g. a substrate, thus forming a measurement area or spot having a measurement area length L. the measurement beam 720 is reflected from the surface towards a detector system 740. The detector system 740 comprises a detector grating 760 which receives the reflected measurement beam and redirects the reflected measurement beam to a detector pair 770.1, 770.2, e.g. CCD arrays, photodiodes or the like. The redirected beams 720.1 and 720.2 are received on photosensitive areas 770.3 resp. 770.4 of the detector pair 770.1, 770.2. The detector pair 770.1, 770.2 is configured to output output signals 790 representing the radiation received from the redirected beams 720.1, 720.2 of the reflected measurement beam 720, and provide these output signals 790 to a processing unit 780 configured to determine a height level of the substrate at the measurement position, i.e. the area with length L covered by the measurement beam 720, based on the received output signals 790.

Figure 8:
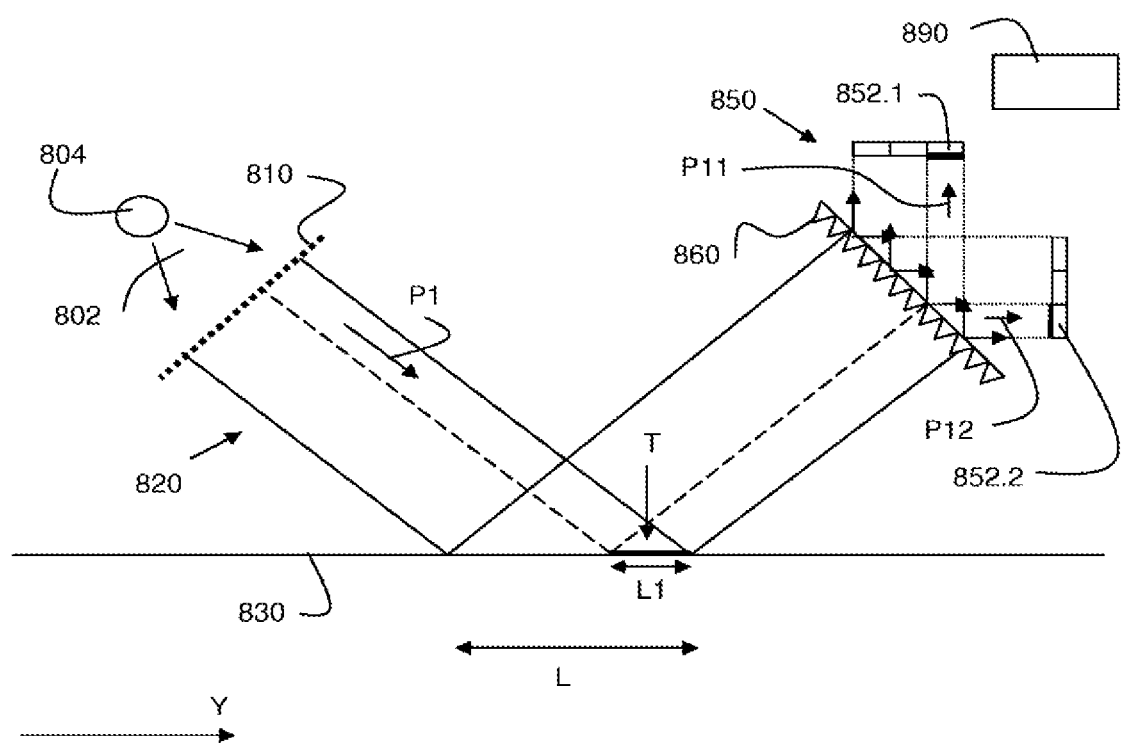
FIGS. 8 to 10 depict a first embodiment of a level sensor according to the present invention.
Figure 9:
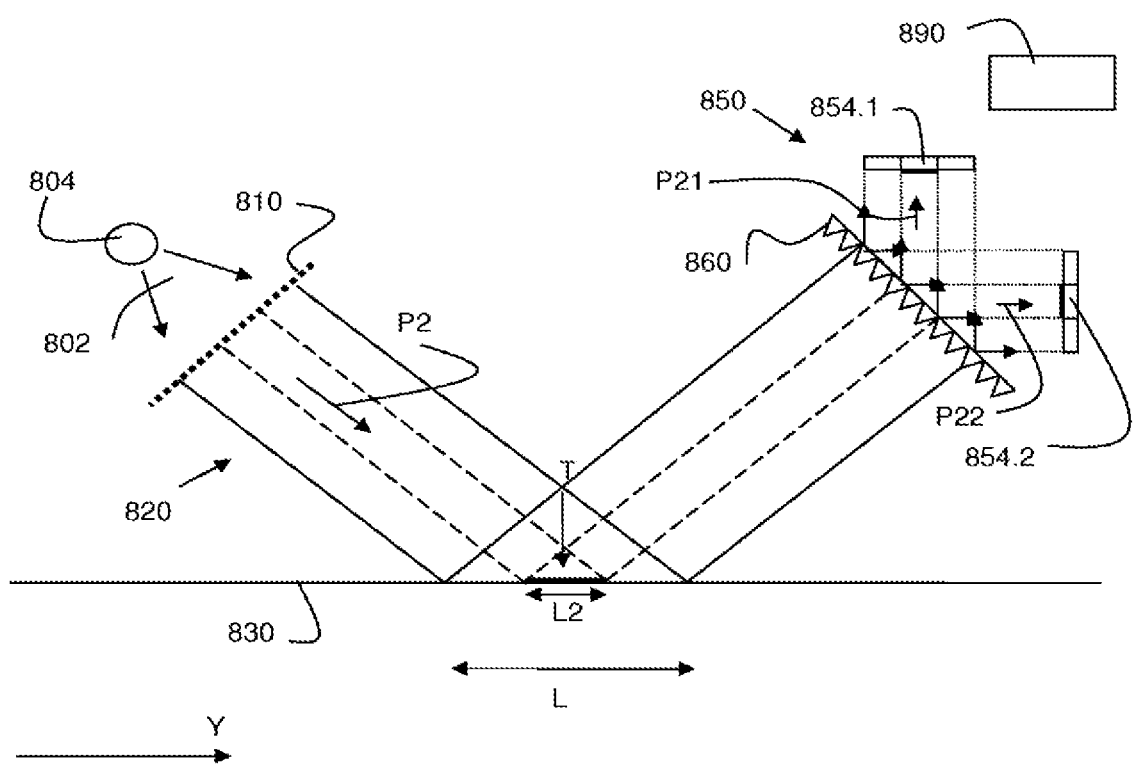
Figure 10:
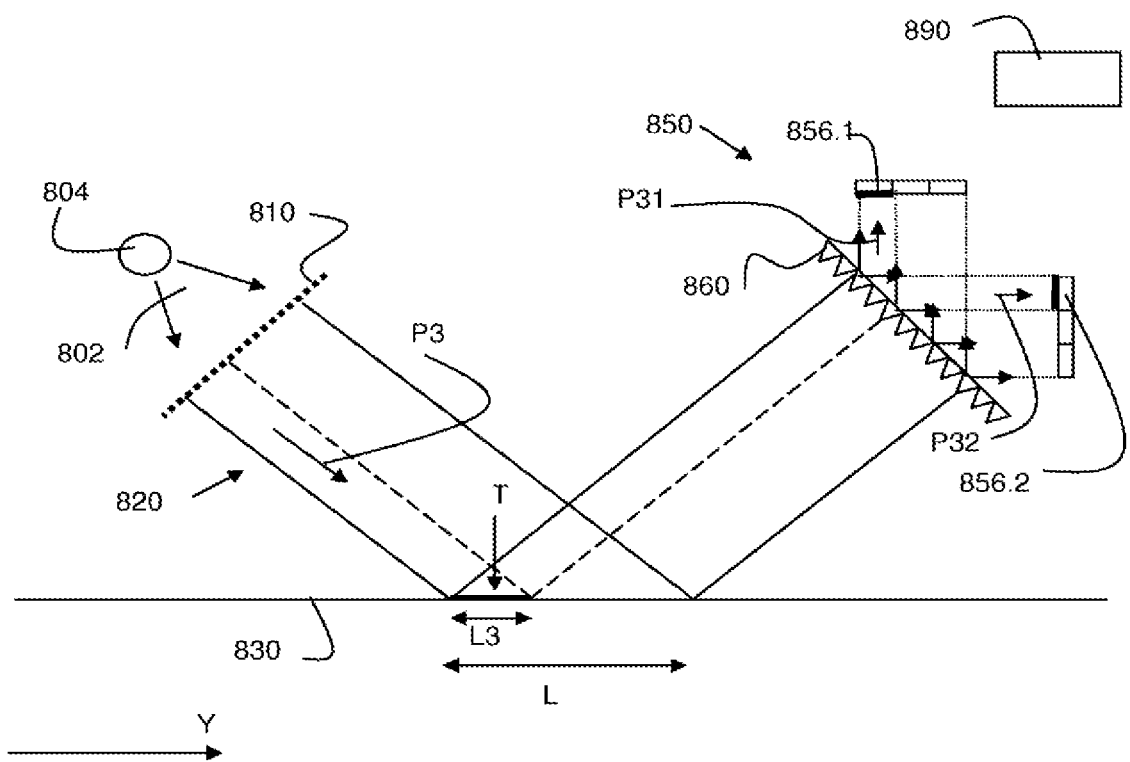

FIGS. 8 to 10 schematically depicts an embodiment of a level sensor as can be applied in a combination of a stage and a level sensor according to the present invention, the figures illustrating the measurement principle as applied in the present invention, the measurement principle enabling to determine a height level of an object with an improved resolution. FIGS. 8 to 10 schematically depict three different positions of the level sensor relative to the object, in particular relative to a target location T on the object. Within the meaning of the present invention, target location is used to denote a position or area on the subject of which the height level is to be determined. As can be seen when comparing FIGS. 8 to 10, the target location T is exposed to different portions of a measurement beam 820. This may e.g. occur during a displacement of the level sensor relative to the object, e.g. when the object is subjected to a scanning movement relative to the level sensor in the Y-direction. In particular, in FIG. 8, the target location T is exposed to a first portion P1 of the measurement beam 820, in FIG. 9, the target location T is exposed to a second portion P2 of the measurement beam 820 and in FIG. 10, the target location T is exposed to a third portion P1 of the measurement beam 820. The embodiment of the level sensor as shown in FIGS. 8 to 10 comprises a projection system configured to generate and project a measurement beam 820 onto the surface 830 of an object, thereby generating a measurement area having a measurement area length L in the Y-direction. In the embodiment as shown, the measurement beam 820 is generated by imparting a light beam 802 from a light source 804 with a projection grating 810, the measurement beam 820 being projected on a surface 830 of an object, e.g. a substrate, thus forming a measurement area or spot having a measurement area length L, e.g. similar to the length L as applied in FIG. 7. The embodiment of level sensor as shown in FIGS. 8 to 10 further comprises a detector system 850. In accordance with the present invention, the detector system 850 is configured to receive different portions of the measurement beam 820 after being reflected off different sub-areas within the measurement area, the different sub-areas being arranged in the Y-direction, and to supply output signals representative of the different portions received. In the embodiment shown, the detector system 850 comprises a detection grating 860 which receives the reflected measurement beam and redirects the reflected measurement beam in a similar manner as the grating 760 of FIG. 7, i.e. the reflected measurement beam is converted to two separate beams, redirected beams, which are received by a plurality of detectors of the level sensor. In the embodiment as shown, the detector system 850 of the level sensor comprises a plurality of detectors, whereby each detector of the plurality of detectors is configured to receive a respective, different portion of the measurement beam 820, the respective different portions of the measurement beam being reflected from respective different sub-areas of the measurement area. Note however that, as will be explained in more detail below, a single detector such as a CCD or CMOS detector may also be applied. In the embodiment as shown, the portion P1 of the measurement beam 820 forms a first measurement sub-area on the object, the first measurement sub-area having a length L1 in the Y-direction, the portion P2 of the measurement beam 820 forms a second measurement sub-area on the object, the second measurement sub-area having a length L2 in the Y-direction, the portion P3 of the measurement beam 820 forms a third measurement sub-area on the object, the third measurement sub-area having a length L3 in the Y-direction. As can be seen, the different sub-areas of the measurement area are arranged adjacent each other in the Y-direction, together forming the total measurement area with length L. In an embodiment, the lengths of the sub-areas are taken equal.

In the embodiment as shown, the detector system 850 comprises three detectors 852, 854 and 856, each of which is configured to receive a different portion of the measurement beam 820. In the embodiment as shown, each detector of the detectors 852, 854, 856 comprises a detector pair for detecting the redirected portions of the different portions of the measurement beam. In particular, as shown in FIGS. 8 to 10, detector 852 comprises a detector pair 852.1, 852.2 that is configured to detect the redirected beams P11 and P12 originating from portion P1 of the measurement beam, i.e. reflected from the first measurement sub-area, detector 842 comprises a detector pair 854.1, 854.2 that is configured to detect the redirected beams P21 and P22 originating from portion P2 of the measurement beam, i.e. reflected from the second measurement sub-area, and detector 856 comprises a detector pair 856.1, 856.2 that is configured to detect the redirected beams P31 and P32 originating from portion P3 of the measurement beam, i.e. reflected from the third measurement sub-area. Phrased differently, each detector or detector pair is associated with a particular sub-area of the measurement area.

The level sensor according to the present invention further comprises a signal processing system 890 for processing output signals from the plurality of detectors. In the embodiment as shown, the signal processing system 890 is configured to receive the output signals of the detector pairs 852.1, 852.2, 854.1, 854.2 and 856.1, 856.2 and process them in order to determine the height level of the target location T on the object. In order to determine the height level, the signal processing system is configured to consecutively retrieve, from each one of the plurality of detectors, an output signal representative of the received portion of the measurement beam when the sub-area associated with respective one of the detectors is aligned with the target location T or when the target location T is in a respective sub-area. Referring to FIGS. 8 to 10, the signal processing system 890 is thus is configured to consecutively receive:

1. output signals from the detector pair 852.1, 852.2, when the target location T is aligned with or inside the first measurement sub-area (FIG. 8),
2. output signals from the detector pair 854.1, 854.2, when the target location T is aligned with or inside the second measurement sub-area (FIG. 9), and
3. output signals from the detector pair 856.1, 856.2, when the target location T is aligned with or inside the third measurement sub-area (FIG. 10).

As such, by displacing the object relative to the level sensor in the Y-direction as indicated, e.g. by means of a stage including an object table to hold the object and positioning device for displacing the object table, the target location T is consecutively 'seen' by all sub-areas, which are provided adjacent or next to each other in the same Y-direction.

Using these signals, the signal processing system 890 may determine the height level at the target location T. As will be appreciated by the skilled person, the output signals from the detector pair 852.1, 852.2, as received when the target location T is aligned with the first measurement sub-area (FIG. 8) already provide sufficient information to arrive at a value for the height level of the target location T. This height level value may however suffer from a poor signal-to-noise ratio because it is based on a comparatively small measurement area, i.e. an area with a length L1, e.g. three times as small as the overall measurement area covered by the measurement beam 820, i.e. a measurement area with a measurement area length L. However, the level sensor according to the present invention enables to perform a height measurement of a target location multiple times; in the embodiment as shown, the height measurement of the target location T may actually be repeated three times, using three different portions P1, P2 and P3 of the measurement beam 820. By doing so, the height level of the target location T may be determined more accurately, compared to a single height measurement using a level sensor applying a comparatively small measurement area.

In order to determine the height level of the target location, using the output signals of the plurality of detectors of the level sensor, various options exist.

Figure 11:
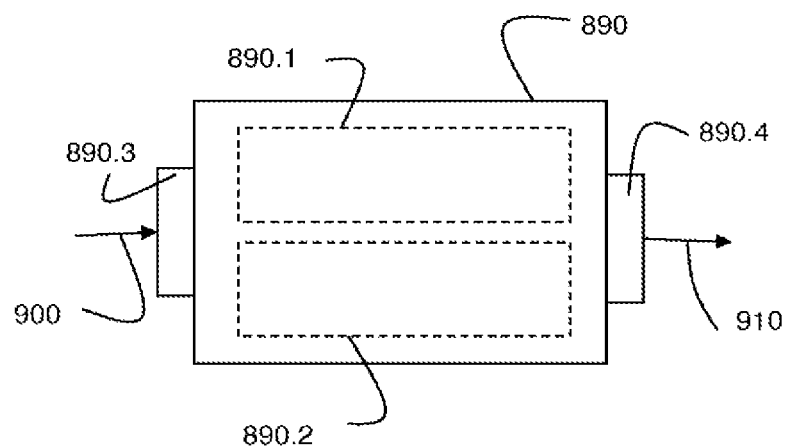
FIG. 11 depicts a signal processing system as can be applied in a level sensor according to the present invention.

In FIG. 11, a signal processing system 890 as can be applied in a level sensor according to the present invention, is schematically shown. A signal processing system 890 as applied in the present invention may e.g. comprise a processor 890.1, a microprocessor, a computer or the like for processing data such as the output signals received. In an embodiment, the signal processing system may further comprises a memory 890.2 or memory unit for storing data such as the received output signals. In the embodiment as shown, the signal processing system 890 comprises an input terminal 890.3 for receiving the output signals 900 from the detector system, e.g. from the one or more detectors of the detector system of the level sensor and an output terminal 890.4 for outputting a signal 910 representing the height level of the target location T.

In an embodiment, the signal processing system is configured to receive the output signals form the detector system, combine the output signals and determine the height level of the target location from the combined output signals. In such embodiment, the signal processing system 890 may be configured to store the output signals in the memory 890.2 as they are received and, when all output signals associated with the target location are received, combine the output signals to determine the height level of the target location T. Referring to the detector arrangement as shown in FIGS. 8 to 10, the signal processing system 890 may e.g. be configured to combine the output signals of detectors 852.1, 854.1 and 856.1, e.g. by adding these signals, and to combine the output signals of detectors 852.2, 854.2 and 856.2, e.g. by adding these signals, and determine the height level of the target location using both combined signals. Alternatively, the signal processing system 890 may be configured to determine, based on the plurality of output signals, a respective plurality of height levels of target location T, the output signals being obtained when the plurality of different sub-areas were aligned with the target location T, and determine the height level of the target location by combining the plurality of height levels.

As an example of combining the output signals or the respective plurality of height levels, determining an average of the output signals or the height levels can be mentioned. The level sensor according to the present invention enables to determine, using a plurality of sub beams of a measurement beam, multiple height measurements of the same target location. These height measurements may e.g. be averaged to arrive at a more accurate value for the height level.

In the embodiment as shown in FIGS. 8 to 10, the measurement beam 820 as applied may e.g. be generated by a grating as shown in FIG. 5, providing in a measurement area on the object that is substantially continuous over the length L.

Figure 12:
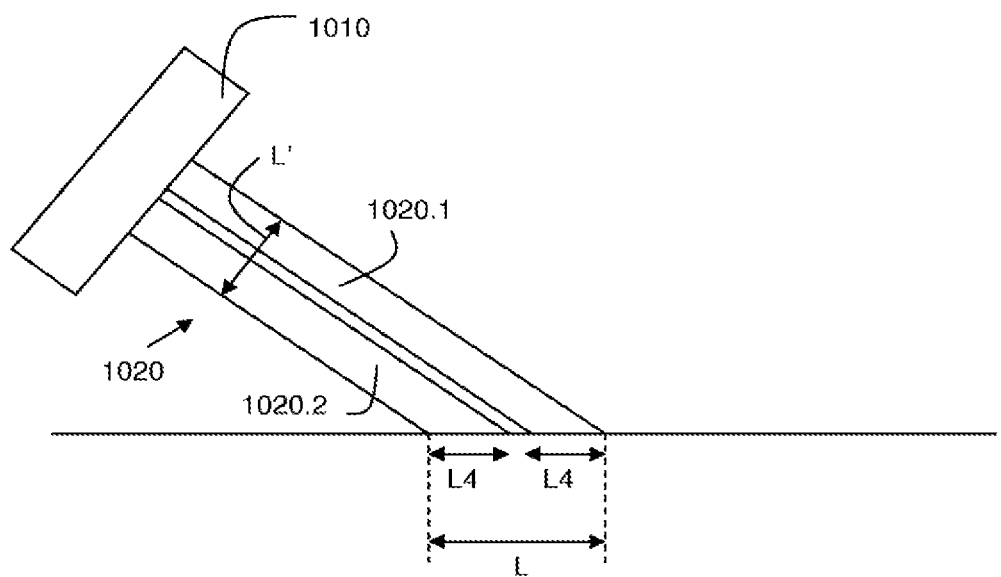
FIG. 12 depicts a projection system as can be applied in a level sensor according to the present invention.

As an alternative however, the measurement beam may also comprise a plurality of discrete sub-beams that are spatially separated. FIG. 12 schematically shows a cross-sectional view of such a measurement beam. FIG. 12 schematically shows a projection system 1010 configured to generate and project a measurement beam 1020 comprising a first sub-beam 1020.1 and a second sub-beam, each providing in a respective measurement sub-area having a length L4<the measurement area length L of the measurement beam 1020. In an embodiment, the different sub-beams may be generated by means of different light sources of the projection system 1010. In an embodiment, the different light sources providing the different sub-beams may have different characteristics, e.g. with respect to applied frequency or frequency content or polarization state. In order to generate the different sub-beams, the projection system 1010 may comprise different gratings to convert light beams from the different light sources to the measurement sub-beams. These different grating may e.g. have different characteristics, e.g. a different pitch.

Figure 13:
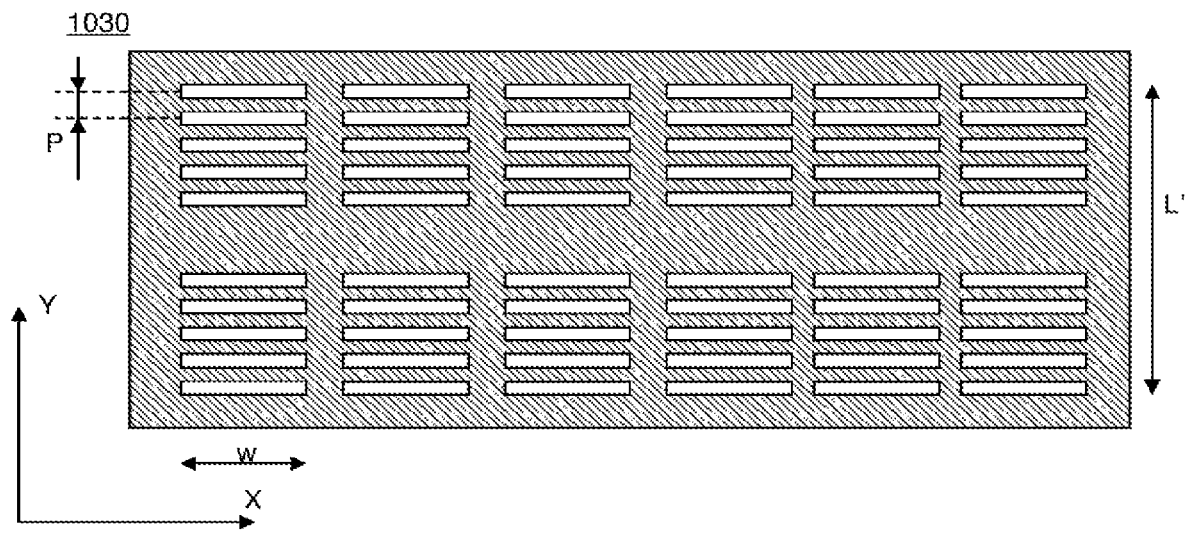
FIG. 13 depicts a projection grating as can be applied in a level sensor according to the present invention.

Alternatively, the sub-beams 1020.1 and 1020.2 may e.g. be generated by a single grating, e.g. a grating as schematically shown in FIG. 13. FIG. 13 schematically shows a grating 1300 for generating two sub-beams. The upper portion of the grating 1300 comprises 6 sets of apertures arranged at a pitch P and may be configured to generate the sub beam 1020.1 when imparted by a light beam. Similarly, the lower portion of the grating 1300 comprises 6 sets of and may be configured to generate the sub beam 1020.2 when imparted by a light beam. FIG. 13 further indicates the width w of the apertures and the length L' of the measurement area as provided by the projection grating 1300 and as also indicated in FIG. 12.

Although projection gratings 500 and 1030 as shown in FIGS. 5 and 13 are transmissive gratings, it is worth noting that the same or similar measurement beams or sub-beams may be generated by means of reflective or diffractive gratings.

In an embodiment of the present invention, the plurality of detectors as applied in the detector system of the level sensor may be discrete detectors such as photo diodes, CCD sensors or CMOS sensors. Referring to FIGS. 8 to 10, the detectors of the detector pairs 852, 854 and 856 may e.g. be photodiodes, CCD sensors or CMOS sensors configured to receive a particular redirected portion (P11 to P32) of the measurement beam applied, e.g. measurement beam 820 or 1020.

As an alternative, the detector system may comprises a CCD or CMOS sensor comprising a two-dimensional array of photosensitive pixels which can be read-out. In such embodiment, the plurality of detectors may consist of portions of the two-dimensional array, each portion being configured and arranged to receive a particular redirected portion of the measurement beam applied.

Figure 14:
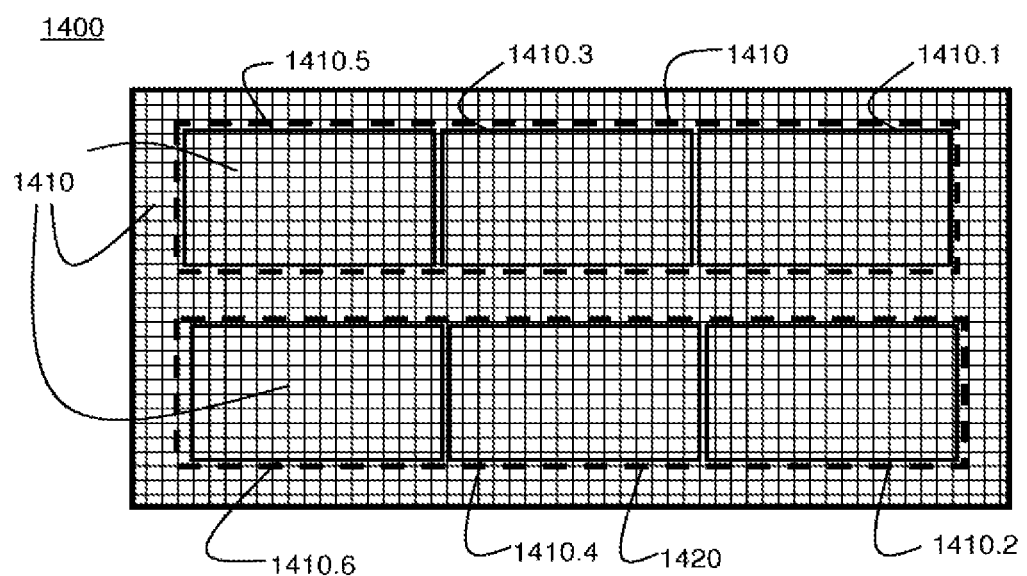
FIG. 14 depicts a sensor as can be applied in a level sensor according to the present invention.

FIG. 14 schematically shows a CCD or CMOS sensor 1400 comprising a two-dimensional array of photosensitive pixels 1410. Schematically indicated on the array by the dotted contours 1410 and 1420 are areas onto which the redirected beams of the complete measurement beam 820 would be projected. As such, with reference to FIGS. 8 to 10, area 1410 could be the photosensitive area of the sensor onto which redirected beams P11, P21 and P31 are projected and area 1420 could be the photosensitive area of the sensor onto which redirected beams P12, P22 and P32 are projected. With reference to FIG. 7, in case a sensor 1400 would be applied in that arrangement, area 1410 could be the photosensitive area of the sensor onto which redirected beam 720.1 is projected and area 1420 could be the photosensitive area of the sensor onto which redirected beam 720.2 is projected. With respect to the schematical presentation of the measurement principles shown in FIGS. 8 to 10, or FIG. 7, it can be pointed out that the detectors forming a detector pair need not be positioned at an angle but can be in plane, e.g. formed by a two-dimensional array such as the array shown in FIG. 14. Additional optical components may be positioned between the detection grating and the plurality of detectors to realize this. Alternatively, or in addition, the redirected beams such as beams P11, P21, P31, P12, P22 and P32 may also be received by the detectors under an oblique angle, i.e. they need not impact the detectors at a straight angle as shown in FIGS. 8 to 10. FIG. 14 further schematically shows areas 1410.1, 1410.2, 1410.3, 1410.4, 1410.5 and 1410.6 onto which the respective redirected beams P11, P12, P21, P22, P22 and P32 as shown in FIGS. 8 to 10 can be projected. As such, in order to perform the measurement sequence as illustrated in FIGS. 8 to 10 using the sensor 1400, areas 1410.1 and 1410.2 could be read out when the target area T is aligned with the measurement sub-area with length L1 as shown in FIG. 8, next, the areas 1410.3 and 1410.4 could be read out when the target area T is aligned with the measurement sub-area with length L2 as shown in FIG. 9, and after that, the areas 1410.5 and 1410.6 could be read out when the target area T is aligned with the measurement sub-area with length L3 as shown in FIG. 10. During this process, the signals outputted from the different sensor areas could e.g. be stored in a memory unit of the signal processing system of the level sensor, e.g. in memory 890.2 of signal processing system 890 as shown in FIG. 11. As will be apparent to the skilled person, in case a CCD array or CMOS sensor or the like is used as described with reference to FIG. 14, one need not decide beforehand the number of detectors, each corresponding to a different photosensitive portion of the sensor 1400, that is applied. Or, phrased differently, the subdivision of the measurement beam into different sub-beams need not be fixed, it may be realized by merely reorganizing the manner in which the signals received at different positions on the sensor are used. As a consequence, one may even operate the level sensor according to an embodiment of the present invention as a conventional sensor for certain areas of a substrate, thereby determining a height level with a resolution associated with a measurement area having a length L, and operating the level sensor at a higher resolution for other areas, e.g. near an edge of the substrate. Note that, in the embodiment as described in FIG. 14, the number of sub-areas may easily be adjusted, ranging from 2 to e.g. 10, when required. In an embodiment, the process of switching between a low resolution and a high resolution need not be predetermined. Rather, when during a scanning operating of a substrate, a comparatively large difference in height level is observed between consecutive target positions, one may, so-called on-the-fly, adjust the processing of the output signals (as described above) in order to operate at a higher resolution.

The combination of a stage and a level sensor according to the present invention may advantageously be applied in a lithographic apparatus according to the present invention to determine a height map of a substrate that is to be exposed to a pattern.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A combination of a stage and a level sensor configured to sense a height level at a target location on an object,
the stage comprising:
an object table configured to hold the object and
a positioning device for displacing the object table relative to the level sensor in a first direction;
the level sensor comprising:
a projection system configured to project a measurement beam onto a measurement area of the object, the measurement area having a substantially continuous measurement area length in the first direction;
a detector system configured to receive different portions of the measurement beam after being reflected off different sub-areas within the measurement area, the different sub-areas being arranged in the first direction, and to supply output signals representative of the different portions received; and
a signal processing system configured to process the output signals from the detector system, wherein the signal processing system is configured to, during a displacement of the object in the first direction by the stage:
consecutively retrieve, for each of the different sub-areas, an output signal representative of the received portion of the measurement beam when the target location is in the sub-area; and
determine the height level of the target location, based on a combination of the output signals.

2. The combination according to claim 1, wherein the detector system comprises:
a plurality of detectors, each detector of the plurality of detectors being configured to respectively receive a different portion of the different portions of the measurement beam.

3. The combination according to claim 1, wherein the signal processing system is configured to:
determine, based on the output signals, a plurality of height levels of the respective different sub-areas; and
determine the height level of the target location by combining the plurality of height levels.

4. The combination according to claim 3, wherein the signal processing system is configured to determine the height level of the target location as an average of the plurality of height levels.

5. The combination according to claim 1, wherein the sub-areas are not overlapping.

6. The combination according to claim 1, wherein the projection system comprises a light source and a projection grating configured to convert a light beam from the light source to the measurement beam.

7. The combination according to claim 6, wherein the projection grating is a transmissive or reflective grating.

8. The combination according to claim 1, wherein the substantially continuous measurement area length is N times a sub-area length, N being an natural number larger than 1.

9. The combination according to claim 1, wherein the detector system comprises a detection grating to receive the different portions of the measurement beam reflected off the measurement area.

10. The combination according to claim 9, wherein each detector comprises a detector pair, the detection grating being configured to convert a received portion of the reflected measurement beam into a pair of beams that are captured by the detector pair.

11. The combination according to claim 1, wherein the detector system comprises a two-dimensional photosensitive array to receive the different portions of the measurement beam after being reflected off the different sub-areas within the measurement area.

12. A lithographic apparatus comprising:
an illumination system configured to condition a radiation beam;
a support constructed to support a patterning device, the patterning device being capable of imparting to the radiation beam a pattern in its cross-section to form a patterned radiation beam;
a projection system configured to project the patterned radiation beam onto a target portion of a substrate; and
a combination of a stage and a level sensor configured to sense a height level at a target location on the substrate,
the stage comprising:
an object table configured to hold the substrate and
a positioning device for displacing the object table relative to the level sensor in a first direction;
the level sensor comprising:
a projection system configured to project a measurement beam onto a measurement area of the substrate, the measurement area having a substantially continuous measurement area length in the first direction;
a detector system configured to receive different portions of the measurement beam after being reflected off different sub-areas within the measurement area, the different sub-areas being arranged in the first direction, and to supply output signals representative of the different portions received; and
a signal processing system configured to process the output signals from the detector system, wherein the signal processing system is configured to, during a displacement of the substrate in the first direction by the stage:
consecutively retrieve, for each of the different sub-areas, an output signal representative of the received portion of the measurement beam when the target location is in the sub-area; and
determine the height level of the target location, based on a combination of the output signals.

13. A device manufacturing method comprising the steps of:
placing a substrate on an object table configured to hold the substrate;
displacing the object table relative to a level sensor in a first direction,
the level sensor performing the steps of;
projecting a measurement beam onto a measurement area of the substrate, the measurement area having a substantially continuous measurement area length in the first direction;
receiving different portions of the measurement beam after being reflected off different sub-areas within the measurement area, the different sub-areas being arranged in the first direction; and generating output signals representative of the different portions received;

processing the output signals by consecutively retrieving, for each of the different sub-areas, an output signal representative of the received portion of the measurement beam when the target location is in the sub-area during a displacement of the object in the first direction by the stage;

determining a height level of the target location, based on a combination of the output signals; and projecting a patterned beam of radiation onto a substrate.

* * * * *

UNITED STATES PATENT AND TRADEMARK OFFICE
CERTIFICATE OF CORRECTION

PATENT NO. : 10,915,033 B2
APPLICATION NO. : 15/779758
DATED : February 9, 2021
INVENTOR(S) : Van Hoof et al.

Page 1 of 1

It is certified that error appears in the above-identified patent and that said Letters Patent is hereby corrected as shown below:

On the Title Page

Item (72), replace "Jeroen Cottaar, Eindhoven (BE)" with --Jeroen Cottaar, Eindhoven (NL)--.

In the Claims

In Column 16, Line 59, replace "performing the steps of;" with --performing the steps of:--.

Signed and Sealed this
Eighteenth Day of May, 2021

Drew Hirshfeld
*Performing the Functions and Duties of the
Under Secretary of Commerce for Intellectual Property and
Director of the United States Patent and Trademark Office*